United States Patent [19]

Shimokoriyama et al.

[11] Patent Number: 5,166,958
[45] Date of Patent: Nov. 24, 1992

[54] CODING APPARATUS WITH LOW-FREQUENCY AND DC SUPPRESSION

[75] Inventors: Makoto Shimokoriyama, Kawasaki; Motokazu Kashida, Musashino, both of Japan

[73] Assignee: Canon Kabushiki Kaisha, Tokyo, Japan

[21] Appl. No.: 533,846

[22] Filed: Jun. 6, 1990

[30] Foreign Application Priority Data

Jun. 13, 1989 [JP] Japan .................. 1-149887

[51] Int. Cl.⁵ ............................................ H04L 27/00
[52] U.S. Cl. ........................................ 375/37; 375/27; 358/135
[58] Field of Search ............... 375/25, 27, 30, 37; 341/143; 381/30, 31; 358/133, 135

[56] References Cited

U.S. PATENT DOCUMENTS

| | | | |
|---|---|---|---|
| 4,569,058 | 2/1986 | Grallert | 375/27 |
| 4,691,233 | 9/1987 | Acampora | 375/27 |
| 4,771,439 | 9/1988 | Okazaki et al. | 358/135 |
| 4,799,242 | 1/1989 | Vermeulen | 381/31 |
| 4,802,004 | 1/1989 | Mattsumoto et al. | 358/133 |
| 4,831,636 | 5/1989 | Taniguchi et al. | 375/27 |
| 4,885,637 | 12/1989 | Shikakura et al. | 358/133 |
| 4,893,123 | 1/1990 | Boisson | 341/143 |
| 4,944,012 | 7/1990 | Morio et al. | 281/30 |

FOREIGN PATENT DOCUMENTS 61-99419  5/1986  Japan .
63-33086  2/1988  Japan .

Primary Examiner—Stephen Chin
Attorney, Agent, or Firm—Fitzpatrick, Cella, Harper & Scinto

[57] ABSTRACT

In a coding apparatus of the invention, codes each consisting of l bits are formed from information data formed by sampling and the m (l and m being integers each equal to at least 2) predictive codes so formed are converted into a code of $(m \times l + a)$ bits (a being a positive integer), so that an information signal can be compressed at a low data error generation ratio and at a high compression ratio.

10 Claims, 3 Drawing Sheets

CODING APPARATUS WITH LOW-FREQUENCY AND DC SUPPRESSION

BACKGROUND OF THE INVENTION

1. Field of the Invention The present invention relates to a coding apparatus.

2. Related Background Art

Generally, in the case of magnetically recording a signal of a high bit rate such as a digital video signal, highly efficient coding to compress a data transmission band is executed, and to further reduce a code error ratio, a DC suppressing process to eliminate components of a very low frequency from a recording signal is executed.

As an example of a highly efficient coding, a predictive difference coding (hereinafter, referred to as a DPCM) for coding a difference value between adjacent sample values has been known. Further, as a DC suppressing process, a mapping coding for suppressing the DC component by converting a code of n bits into another code of m bits has been known.

As a method of efficiently executing such highly efficient coding and DC suppression as mentioned above, the assignee of the present invention has proposed a coding method wherein when a difference value is coded, a code of a small CDS (Codeword Digital Sum) value is assigned to any difference value of a high occurrence frequency (Japanese Laid-Open Patent Application No. 61-99419). On the other hand, as a method of further efficiently executing the DC suppression, the assignee of the present invention has proposed a coding method wherein a plurality of difference values are converted into codes of a suppressed DC component (Japanese Laid-Open Patent Application No. 63-33086).

By using those methods, the DC component can be suppressed without increasing redundancy of the code series.

Now, considering the case where the redundancy is not increased by the above method, the code after completion of the code conversion includes a certain DC component, in dependence on the pattern of the difference codes. Therefore, particularly, in the case where the DC component must be suppressed to an extremely small level, for instance, it is difficult to apply such a method to a coding apparatus for DPCM coding a high definition television signal (hereinafter, referred to as an HD signal).

On the other hand, when a television signal is DPCM coded and magnetically recorded, actually, codes (PCM codes) in which the sample values have been directly quantized to prevent the error propagation of DPCM, check bits of an error correction code, and other codes such as sub-codes, exist, and therefore the DC component of such codes must be also suppressed. However, according to the foregoing method, it is difficult to suppress the DC component of such other codes.

SUMMARY OF THE INVENTION

It is an object of the invention to provide a coding apparatus which can solve the foregoing problems.

Another object of the invention is to provide a coding apparatus in which an information signal can be compressed at a low error generation ratio of data and at a high compression ratio.

To achieve the above objects, according to the invention, as one embodiment, there is provided a coding apparatus for coding an information signal, comprising: encoding means for forming, codes each consisting of l bits (l being an integer equal to at least 2) from the information data formed by sampling; and converting means for converting the m (m being an integer equal to at least 2) predictive codes formed by the predictive coding means into a code of predetermined number of bits greater than $m \times l$.

Another object of the invention is to provide a coding apparatus in which not only an information signal but also information codes which are added to the information signal can be compressed at a low error generation ratio of data and at a high compression ratio.

The achieve such object, according to the invention, as one embodiment, there is provided a coding apparatus for coding an information signal, comprising: coding means for forming codes each consisting of l bits (l being an integer equal at least to 2) from sampled information data; information code generating means for generating an information code consisting of $(m \times l)$ bits (m being an integer equal to at least 2); and converting means for converting the m codes formed by the coding means or the information code generated from the information code generating means into a code being a predetermined number of bits greater than $m \times l$.

The above and other objects and features of the present invention will become more fully apparent from the following detailed description and the preferred embodiment with reference to the accompanying drawings.

DETAILED DESCRIPTION OF THE PREFERRED EMBODIMENT

An embodiment of the present invention will be described hereinbelow with reference to the drawings.

Figure 1:
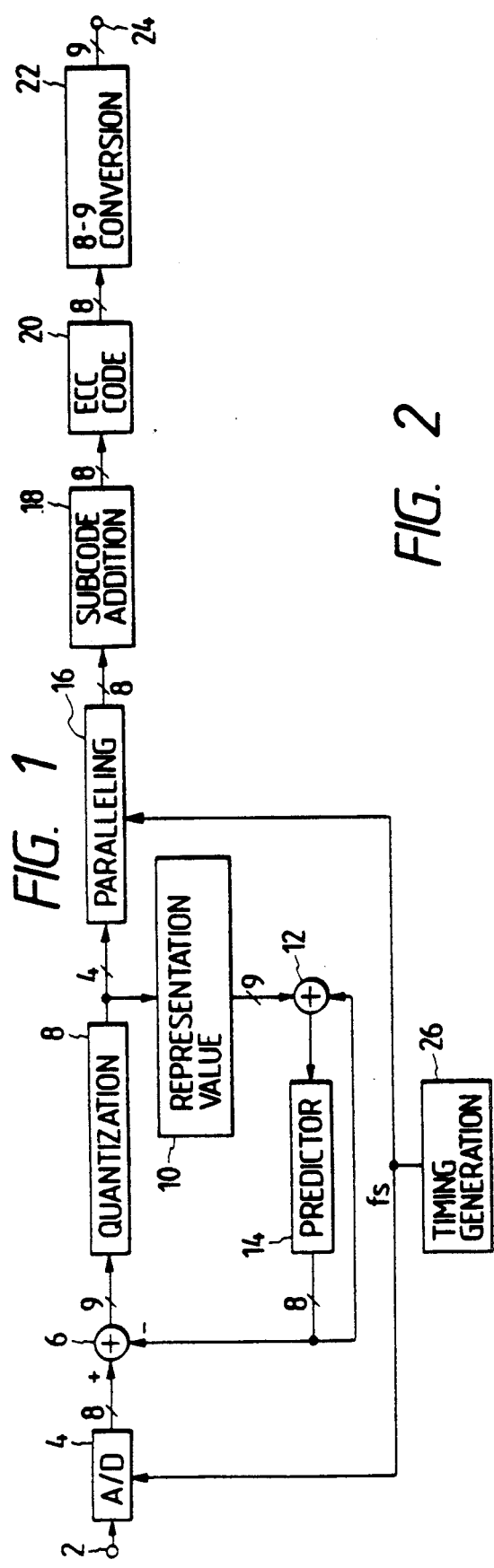
FIG. 1 is a diagram showing a construction of a coding apparatus according to an embodiment of the present invention.

FIG. 1 is a diagram showing an arrangement of a coding apparatus as an embodiment of the invention. In the diagram, reference numeral 2 denotes an input terminal of an analog video signal. The input analog video signal is converted into the digital signal by an A/D converter 4. The A/D converter 4 operates at a sampling frequency $f_s$ by clocks of the frequency $f_s$ which are generated by a timing signal generating circuit 26.

A code of eight bits from the A/D converter 4 is input to a subtracter 6 and is subtracted from a predictive value from a predictor 14 so that a difference value of nine bits is obtained. The 9-bit difference value is converted into a difference code of four bits by a nonlinear quantization unit 8. The 4-bit difference code which is output from the quantization unit 8 is supplied as a coding code to a representation value setting circuit 10 and a parallelization circuit 16.

The representation value setting circuit 10 has characteristics opposite to those of the quantization unit 8 and obtains a difference decoded value (quantization representation value) of nine bits from the 4-bit difference code.

Figure 2:
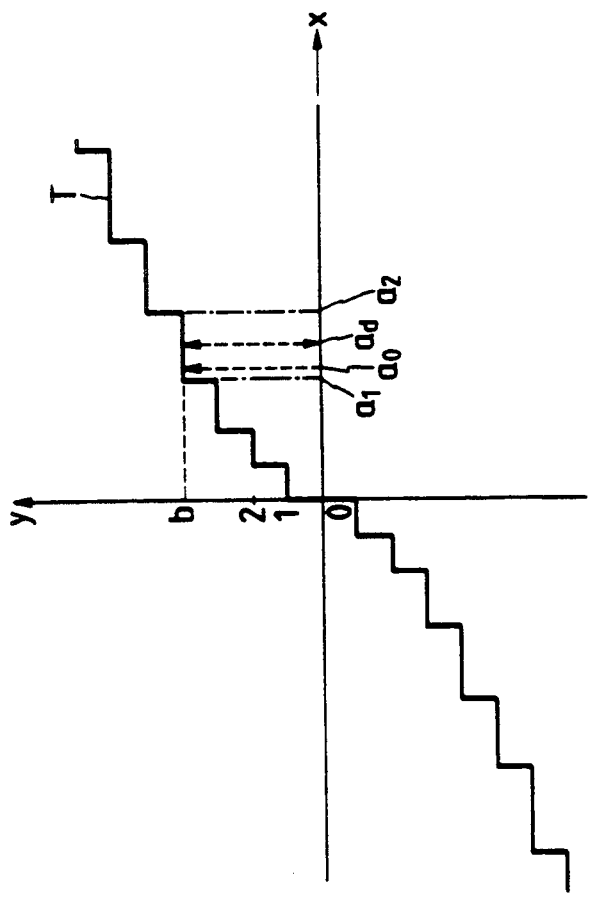
FIG. 2 is a diagram showing characteristics of a quantization unit and representation value setting circuit in FIG. 1.

FIG. 2 shows an example of the characteristics of the quantization unit 8 and representation value setting circuit 10. In the diagram, the X axis denotes a difference value and the Y axis indicates a difference code. As shown in the diagram, when the difference values are set to $a_1$ to $a_2$, the difference code is set to b. Further, the difference decoded value is set to $a_d$ as a representation value of $a_1$ to $a_2$. For instance, when a difference value $a_0$ is input to the quantization value 8, the difference code b is obtained and the difference decoded value $a_d$ is derived by the representation value setting circuit 10. Although the value ($a_0-a_d$) is taken as a quantization error, since the next predictive value is obtained on the basis of the difference decoded value including the quantization error, the quantization error is not accumulated. An adder 12 adds the difference decoded value and the predictive value and calculates the decoded value including the quantization error. The decoded value is input as a local decoded value to the predictor 14.

Assuming that the predictor 14 is a delay circuit having a delay time corresponding to one sample period for simplicity of explanation, a local decoded value of one sample before (i.e., the immediately-preceding sample) is supplied to the subtracter 6.

Figure 3:
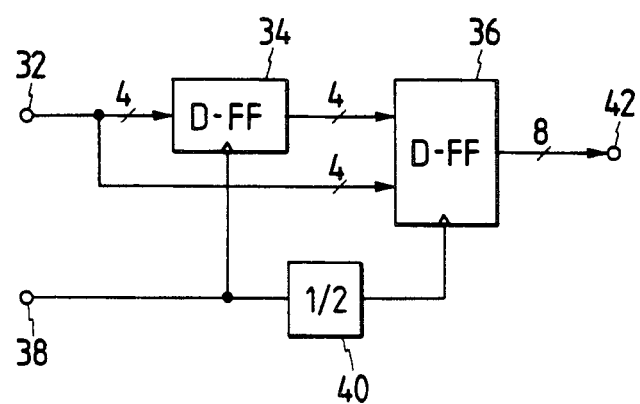
FIG. 3 is a diagram showing a practical constructional example of a parallelization circuit in FIG. 1.

The parallelization circuit 16 outputs an 8-bit code from two samples of 4-bit difference codes. FIG. 3 shows a practical constructional example of the parallelization circuit 16. In FIG. 3, reference numeral 32 denotes an input terminal which receives a 4-bit difference code. Reference numeral 38 indicates a terminal to which the clocks of frequency $f_s$ generated from the timing signal generating circuit 26 are input. A D-type flip-flop (D-FF) 34 delays the 4-bit difference code by one sample and inputs it to the D-FF 36 together with the second 4-bit difference code which has not delayed. The D-FF 36 is operated by the clocks which are obtained by frequency clocks of frequency $f_s$ by $\frac{1}{2}$, by means of a frequency divider 40, and outputs an 8-bit code comprising two adjacent difference codes from a terminal 42.

A code train of eight bits which is output from the parallelization circuit 16 are supplied to a subcode addition circuit 18, so that a code train to which an 8-bit subcode has been added are derived. The code train added with the subcode is input to an error correction code (ECC) coding circuit 20, so that an 8-bit code train to which ECC check bits have further been added is obtained.

The code train from the ECC coding circuit 20 is supplied to an 8-9 converter 22 and each code of eight bits is converted into a code of nine bits. The 8-9 converter 22 further effects the characteristics of an image which could not be effectively used in the non-linear quantization in the predictive coding process at the front stage and converts 8-bit code into 9-bit code having an extremely small DC component.

The characteristics of the 8-9 conversion mentioned above will now be described with reference to FIGS. 4, 5A, 5B, and 6.

Figure 4:
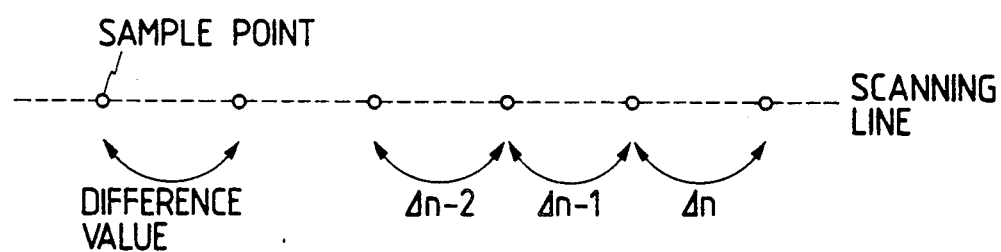
FIG. 4 is a diagram for explaining the formation of a difference code.
Figure 5A:
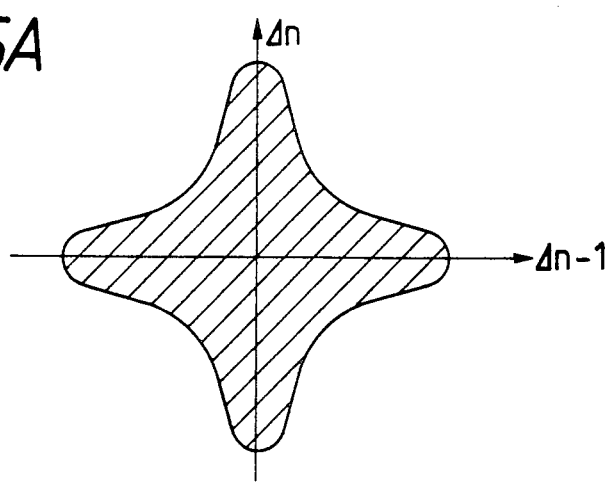
FIGS. 5A and 5B are diagrams showing generation distributions of two difference values.

FIG. 5A shows a two-dimensional plane of occurrence distributions of difference values $\Delta n$ and $\Delta n-1$ at two continuous points calculated from sample values which were obtained by sampling as shown in FIG. 4. In FIG. 5A, the ordinate indicates $\Delta n$ and the abscissa represents $\Delta n-1$ in a linear manner. The occurrence distributions of a combination of the difference values $\Delta n$ and $\Delta n-1$ are concentrated in a region including the origin as shown in a hatched portion in FIG. 5A. Since many combinations of the difference values $\Delta n$ and $\Delta n-1$ in the region corresponding to the hatched portion in FIG. 5A occur, if a quantization unit having non-linear quantization characteristics such as to finely set quantization steps for the difference values in such a portion is used as a quantization unit 8 in FIG. 1, the sample values can be coded with a higher fidelity.

Figure 5B:
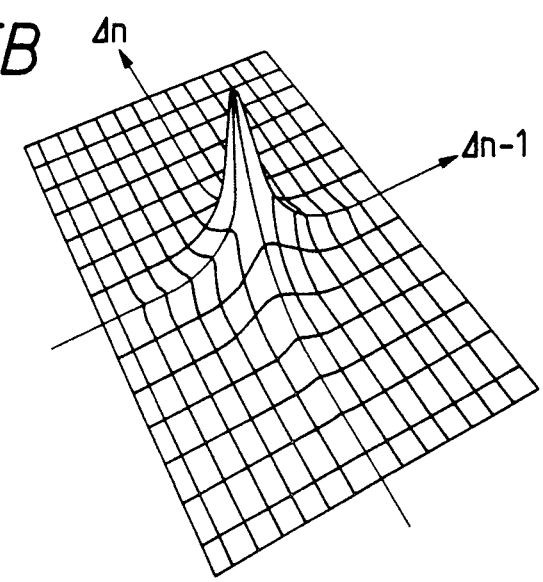

Further, when $\Delta n$ on the ordinate and $\Delta n-1$ on the abscissa in FIG. 5A are non-linearly shown as mentioned above and, further, the occurrence frequency is set in the vertical direction and the occurrence frequencies of the difference values $\Delta n$ and $\Delta n-1$ are expressed, as shown in FIG. 5B, there is obtained a peak in which the occurrence frequencies are large at the zero points (origin) of the continuous difference values $\Delta n$ and $\Delta n-1$ as a center.

On the other hand, the occurrence frequency distribution shown in FIG. 5B is divided by boundary lines in a manner such that the sum of the occurrence frequencies in the regions of the boundary lines is equal for every region and the divided distributions are shown as a two-dimensional plane. The result is as shown in FIG. 6.

Figure 6:
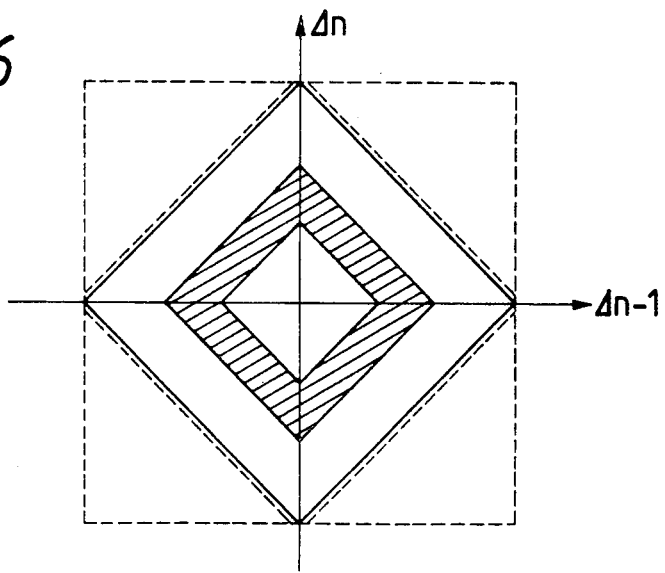
FIG. 6 is a diagram for explaining occurrence frequencies of two difference codes which were nonlinearly quantized.

In the case where the occurrence frequency distribution has been divided by the boundary lines, there is a tendency that the hatched portion in FIG. 6 corresponds to the portion in which the sum value of the occurrence frequencies is the highest for one of the non-linear quantization steps for the difference values. Therefore, in the 8-9 converter 22 having a memory to hold the conversion data, 9-bit codes are held as a table so as to obtain the 9-bit output conversion data which satisfies the relation that the 9-bit code of the smallest absolute value of the CDS is most preferentially assigned with respect to a combination of the two difference codes corresponding to the combination of the difference values $\Delta n$ and $\Delta n-1$ corresponding to the hatched portion in FIG. 6. With respect to the other portions as well in a manner similar to the above, a tendency of the occurrence frequency for one of the non-linear quantization steps for the difference values is examined. The codes of small absolute values of the CDS are assigned in accordance with the order from the largest sum of the occurrence frequencies. In FIG. 6, in the occurrence o distributions of the continuous difference values $\Delta n$ and $\Delta n-1$, the portions shown by broken lines on the outside show regions in which combinations of the difference values which do not occur in the actual difference image data are distributed. That is, in FIG. 6, since it is sufficient to prepare the conversion codes only for the combinations of the difference values $\Delta n$ and $\Delta n-1$ which are distributed in the regions other than the broken line portions, the pattern of the conversion codes can be limited and the DC component can be further suppressed as compared with the ordinary 8-9 conversion. Namely, at this time, by selecting the codes of small absolute values of the CDS from the pattern of the conversion codes, even in the case of an arbitrary pattern of difference codes, it is possible to execute the conversion of an extremely high efficiency while suppressing the DC and low frequency components.

Therefore, particularly, even in the case where the codes are transmitted to the transmission system in which the DC component must be sufficiently suppressed, the generation of code errors can be sufficiently reduced.

On the other hand, with respect to the subcodes and the check bits of ECC which were added by the subcode addition circuit 18 and ECC coding circuit 20, the DC component can be also suppressed. An increase in errors on the transmission path can be prevented by the existence of such codes having no correlation.

Although the above embodiment has been described with respect to an example in the case where the difference code consists of four bits and two difference codes are converted into a 9-bit code, generally, a similar effect is also obtained in the case where each difference code consists of l bits and every m difference codes (l and m being integers each equal to or greater than 2) are converted into a code $(m \times l + a)$ bits (a being a positive integer).

As described above, according to the coding apparatus of the embodiment, the DC component can be suppressed irrespective of the pattern of the difference codes, the DC component can be suppressed to an extremely low level as a whole, and the codes themselves can also be compressed.

What is claimed is:

1. A coding apparatus for coding an information signal, comprising:
   (A) coding means for forming codes each consisting of l bits (l being an integer equal to at least 2) from information data formed by sampling; and
   (B) converting means for converting m (m being an integer equal to at least 2) codes formed by the coding means into a code corresponding to a combination of the m codes, the code having a predetermined number of bits, the predetermined number being greater than $m \times l$.

2. An apparatus according to claim 1, wherein the coding means further comprises difference coding means for forming difference codes each consisting of l bits, as codes, corresponding to difference values of the information data formed by sampling.

3. An apparatus according to claim 1, wherein the converting means is arranged so as to convert the m codes formed by the coding means into the code corresponding to the combination of the m codes, the code having the predetermined number of bits having a reduced low frequency component.

4. An apparatus according to claim 1, wherein the converting means is arranged so as to convert the m codes formed by the coding means into the code corresponding to the combination of the m codes, the code having the predetermined number of bits in which the number of continuous bits "1" or "0" is always less than a second predetermined number.

5. A coding apparatus for coding an information signal, comprising:
   (A) coding means for forming codes each consisting of l bits (l being an integer equal to at least 2) from information data formed by sampling;
   (B) information code generating means for generating an information code of $(m \times l)$ bits (m being an integer equal to at least 2); and
   (C) converting means for converting m codes formed by the coding means into a code corresponding to a combination of the m codes, the code having a predetermined number of bits, the predetermined number being greater than $(m \times l)$, and converting the information code generated by the information code generating means into a code having the same number of bits as the code converted from the m codes formed by the coding means.

6. An apparatus according to claim 5, wherein the coding means further comprises difference coding means for forming difference codes each consisting of l bits, as codes, corresponding to difference values of the information data formed by sampling.

7. An apparatus according to claim 5, wherein the converting means is arranged so as to convert the m codes formed by the coding means into the code corresponding to the combination of the m codes, the code having the predetermined number of bits having a reduced low frequency component, and wherein the converting means converts the information code generated by the information code generating means into the code having the predetermined number of bits having a reduced low frequency component.

8. An apparatus according to claim 5, wherein the converting means is arranged so as to convert the m codes formed by the coding means into the code corresponding to the combination of the m codes, the code having said predetermined number of bits in which the number of continuous bits "1" or "0" is always less than a second predetermined number, and wherein the converting means converts the information code generated by the information code generating means into the code having the predetermined number of bits in which the number of continuous bits "1" or "0" is always less than the second predetermined number.

9. An apparatus according to claim 5, wherein the information code generating means is arranged so as to generate original information data which has not been coded by the coding means as the information code.

10. An apparatus according to claim 5, wherein the information code generating means is arranged so as to generate an error correction code as the information code.

* * * * *

UNITED STATES PATENT AND TRADEMARK OFFICE
CERTIFICATE OF CORRECTION

PATENT NO. : 5,166,958
DATED      : November 24, 1992
INVENTOR(S): MAKOTO SHIMOKORIYAMA, ET AL.

It is certified that error appears in the above-identified patent and that said Letters Patent is hereby corrected as shown below:

Title page, item

[56] REFERENCES CITED

Under U.S. PATENT DOCUMENTS, "Mattsumoto et al." should read --Matsumoto et al.--.

COLUMN 1

Line 6, "The" should read --¶ The--.
Line 26, "wherein" should read --wherein,--.

COLUMN 2

Line 2, "forming," should read --forming--.
Line 7, "predetermined" should read --a predetermined--.
Line 8, "mx." should read --$mx.\ell$--
Line 28, "and" should read --of--.
Line 60, "the" should be deleted.

COLUMN 3

Line 10, "X axis" should read --X-axis--.
Line 11, "Y axis" should read --Y-axis--.
Line 19, "a" should be deleted.
Line 24, "calculates" should read --so calculates--.
Line 43, "delayed." should read --been delayed.--.
Line 45, "frequency clocks" should read --frequency-dividing the clocks--.
Line 49, "is" should read --are--.
Line 50, "are" should read --is--.
Line 52, "are" should read --is--.

UNITED STATES PATENT AND TRADEMARK OFFICE
CERTIFICATE OF CORRECTION

PATENT NO. : 5,166,958
DATED : November 24, 1992
INVENTOR(S) : MAKOTO SHIMOKORIYAMA, ET AL.

It is certified that error appears in the above-identified patent and that said Letters Patent is hereby corrected as shown below:

COLUMN 4

Line 54, "o" should be deleted.

COLUMN 5

Line 21, "code" should read --code of--.

Signed and Sealed this

Twenty-second Day of February, 1994

Attest:

BRUCE LEHMAN

Attesting Officer     Commissioner of Patents and Trademarks